Oct. 14, 1969 W. LEGAT ET AL 3,471,922

MONOLITHIC INTEGRATED CIRCUITRY WITH DIELECTRIC ISOLATED FUNCTIONAL REGIONS

Filed June 2, 1966

INVENTORS
WILHELM H. LEGAT
LEWIS K. RUSSELL

BY [signature]
AGENT

United States Patent Office
3,471,922
Patented Oct. 14, 1969

3,471,922
MONOLITHIC INTEGRATED CIRCUITRY WITH DIELECTRIC ISOLATED FUNCTIONAL REGIONS
Wilhelm Legat, Woodside, and Lewis K. Russell, Livermore, Calif., assignors to Raytheon Company, Lexington, Mass., a corporation of Delaware
Filed June 2, 1966, Ser. No. 554,869
Int. Cl. H01l 5/00, 11/00, 15/00
U.S. Cl. 29—580 5 Claims

ABSTRACT OF THE DISCLOSURE

An integrated circuit device having a plurality of electrically isolated active semiconductor areas mounted in spaced insulated relation upon a supporting layer, the major portion of which comprises polycrystalline semiconductor material and which has projecting portions extending between the respective active areas, the supporting layer having a number of electrically conductive regions extending completely therethrough whereby portions of the deivce may thereafter be removed by electrolytic etching, thereby producing an integrated circuit device wherein all of the component parts thereof are formed to critical, precise dimensions, and method of making same.

This invention relates to integrated circuits and has particular reference to integrated circuit devices having isolated active areas and to a novel method of making such integrated circuit devices.

In the manufacture of microcircuits and integrated circuit devices, a difficult problem has been the isolation of the active areas from each other. The prior art is replete with microcircuits or integrated circuits wherein the active areas are to some degree isolated from one another by providing diffused areas or channels between the active areas or by providing spaces between the active areas which are produced by chemical milling or etching techniques. Isolation by diffusion has proved to be a relatively expensive and somewhat complicated technique which has not been entirely acceptable to the semiconductor industry. Chemical milling or etching a semiconductor device in order to isolate active areas thereof has also been unsatisfactory because of the lack of control over the etching process which results in the respective active areas having nonuniform electrical characteristics.

The objections and disadvantages encountered in known isolation deivces and techniques are overcome in the present invention wherein isolation between active areas of an integrated circuit is provided by surrounding etch-separated active areas or islands by oxide-coated channels containing undoped silicon which assists in maintaining the islands in desired spaced relation and which forms a part of the entire circuit-supporting means. The various active areas of the device are efficiently and economically isolated, the resultant areas being well defined by channel-like regions which are formed by electrolytic etching processes, whereby the isolated areas are manufactured to desired close tolerances.

Known devices have been formed by diffusion isolation, as mentioned above, followed by mechanical lapping and polishing to reduce the active areas or islands to the size required for producing the desired electrical characteristics. Such precise mechanical processes are inherently uncontrollable. In accordance with the method of the present invention, the islands are formed by first epitaxially depositing an N-layer on a suitable P-type handle and then etching the active areas by an electrolytic process which is self-limiting and therefore produces precisely dimensioned islands without the requirement of additional mechanical processing. The use of epitaxial deposition assures the existence of uniformly thick and uniformly doped islands, and the electrolytic etch of this invention assures uniform desired lateral dimensions of the islands.

Figures 1, 2, 3, 5:
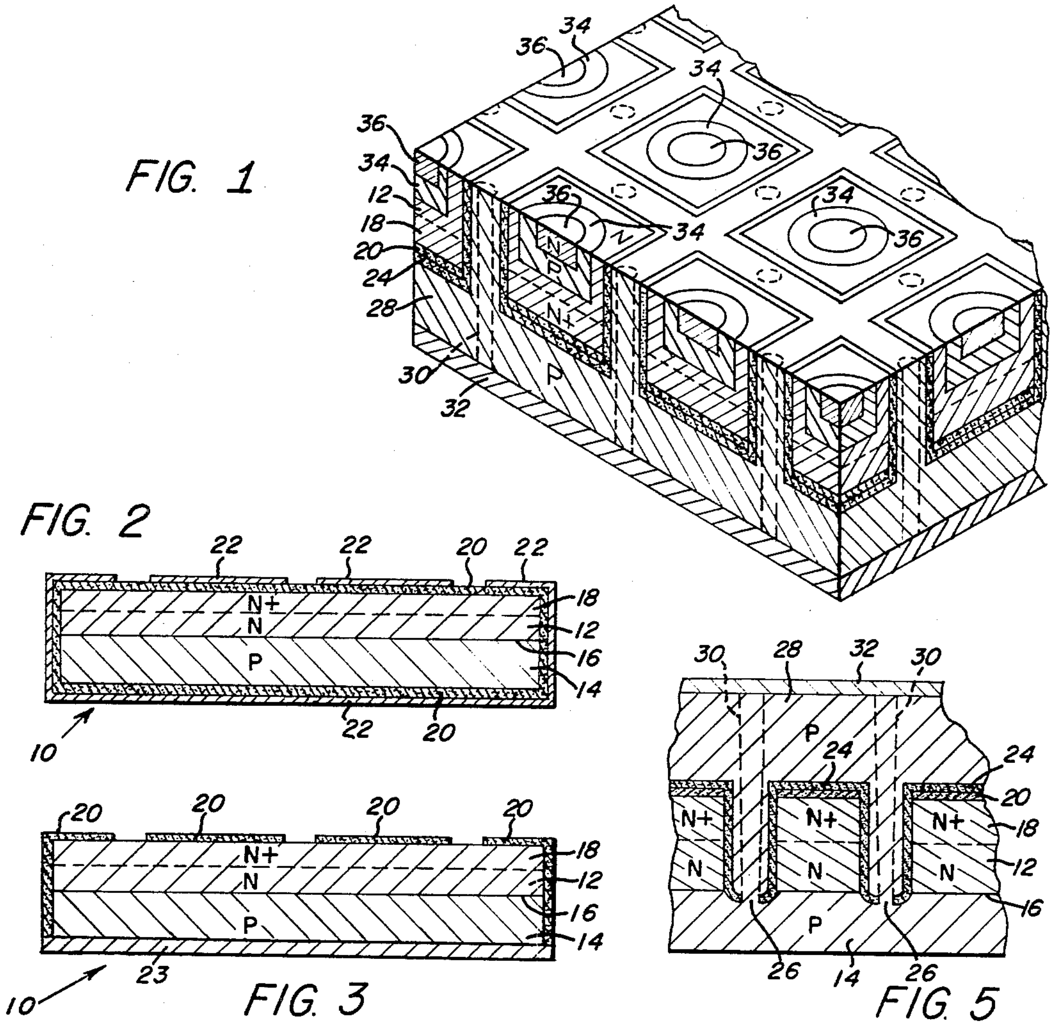

Other advantages and objectives of this invention will become apparent from the following description taken in connection with the accompanying drawings, wherein:

FIG. 1 is a greatly enlarged partial fragmentary sectional view of a portion of an integrated circuit device embodying this invention; and FIGS. 2, 3, 4, 5 and 6 illustrate the integrated circuit device of FIG. 1 at various stages during the fabrication thereof.

In the manufacture of the integrated circuit device embodying the invention, there is first provided a wafer 10 (FIG. 2) which comprises a P-type region 14 and an N-type region 12 joined by a P–N junction indicated by line 16. This wafer 10 can be made by any conventional method such as, for example, by pulling a silicon rod of crystal ingot from a melt comprised of silicon and at least one element from Group V of the Periodic Table, for example, boron, indium, gallium or aluminum. A slice is then cut from the rod with a suitable saw, after which the slice may be lapped, etched, or otherwise provided with smooth surfaces.

The wafer or slice is processed by conventional lapping polishing and etching processes to a desired resultant size such as, for example, about six mils thick and one inch in diameter. This produces a substarate which is of P-type conductivity since the dopant used during the crystal growing process was boron, indium, gallium, aluminum or other material known to proivde silicon with P-type conductivity, the dopant being of a concentration such as $10^{18}$ atoms per cubic cm., for example.

The N-type region 12 can be provided by conventional alloying or diffusion techniques or may be epitaxially deposited. For example, the P-type slice is placed, after cleaning, in a reactor where it is heated at about 1200° C. in a hydrogen atmosphere for about five minutes, at which time silicon tetrachloride which has been suitably doped with the selected N-type dopant or impurity is passed through the reactor. This material decomposes and results in the deposition of single crystal silicon on the surface of the slice 10. At the termination of this process the resultant epitaxial layer 12 may be 10–25 microns thick, for example, or any other selected thickness depending upon the duration and temperature of the process and the electrical requirements of the device being fabricated. To provide the layer 12 with N-type conductivity, the silicon tetrachloride is doped with the selected amount of antimony, arsenic or phosphorus which will provide the layer with the desired resistance characteristics.

The semiconductive crystal slice 10 can be silicon, as mentioned above, or it may be suitably doped germanium or a stoichiometric compound of elements of Groups III and V of the Periodic Table, for example, gallium arsenide, gallium antimonide, gallium phosphide, indium arsenide and indium antimonide or, possibly, elements of Groups II and VI such as cadmium telluride or cadmium sulfide. The P- and N-regions may also be fabricated in reverse order if desired, the objective being to provide a P-N junction 16 between the N- and P-regions 12 and 14 respectively.

At this stage, it is preferable to deposit on the N-layer 12 an N+-layer 18 which is of lower resistivity than the N-layer 12. This may be done by continuing the epitaxial deposition of the N-layer 12 while simultaneously increasing the amount of dopant which is introduced into the silicon tetrachloride as it passes through the reactor. It is to be understood, however, that the N+-layer 18 may be deposited as a separate step in the procedure, if desired.

When the P-N junction wafer 10 has been formed as described, the surfaces are coated with a layer 20 of silicon dioxide, this being done by any of the known thermal growing, vapor deposition, or other oxidation techniques to form the oxide film to a thickness of two to four microns, for example. The silicon dioxide layer 20 is then covered with a photoresist material 22 such as the solution known as KPR sold under that terminology by Eastman Kodak Co., for example. This coating 22 is exposed to ultraviolet, or other radiation to which it is sensitive, through a photographic film (not shown) which is prepared with a selected pattern thereon. Developing then takes place by dipping the wafer in a solution such as trichloroethylene to remove unsensitized KPR. The wafer is then baked at about 150° C. for about ten minutes whereupon the remaining photoresist material is hardened to form a mask supported by the silicon dioxide layer 20 and having the desired configuration as shown in FIG. 2.

The wafer is then placed in a solution containing about one part of hydrofluoric acid (HF) and nine parts of ammonium fluoride ($NH_4F$) to etch away the areas of the silicon dioxide which are exposed through the openings in the photoresist pattern 22, following which it is rinsed in water and dried. The photoresist pattern may now be removed by immersion in a solution of one part sulphuric acid and nine parts of nitric acid at about 100° C. for about ten minutes. However, the photoresist may be left on if desired because it will be automatically removed in the following etching process. The device upon removal of the photoresist will appear as shown in FIG. 3, after which an ohmic contact 23 is applied over layer 14.

At this point the process of isolating active areas of the device is started. This comprises first etching through the N-regions 12 and 18 to a point slightly beyond the P-N junction 16. This is preferably accomplished by placing the device of FIG. 3 in an electrolytic mixture comprising an approximate 5% solution of HF (40 to 50%) in methyl alcohol (96 to 98%). When a suitable current is applied, the N-regions are attached through the windows in oxide layer 20 and etching is allowed to take place for a length of time necessary to etch grooves down to the junction 16. The etching rate depends upon the thickness of the regions 12 and 18, the current, and consequently the etching rate of the solution used.

Figure 4:
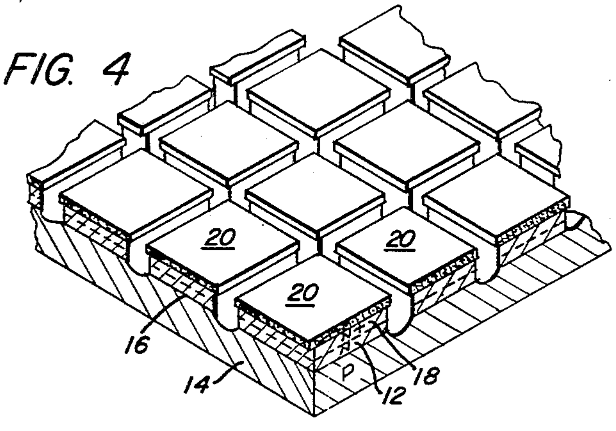
Figure 6:
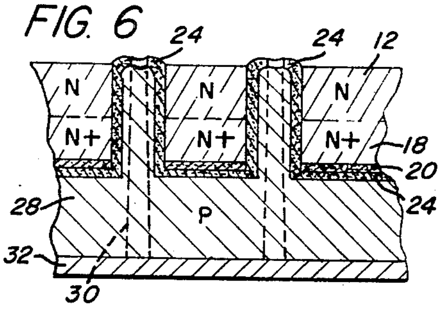

It is apparent that the electrolytic etching thus described produces a channeled wafer, substantially as illustrated in FIG. 4, which comprises separate islands each embodying an N-N+ region 12–18 covered with oxide 20, the islands being completely separated from one another but all being mounted on a common handle which is the P-layer 14.

The channeled wafer is now reoxidized by any of the methods referred to above, including the channel surfaces, and windows are cut through the oxide at selected positions at the bottoms of the channels. Referring to FIG. 5, it will be seen that the newly deposited oxide layer 24 extends down into the channels and completely covers the sides and bottom thereof. At this point a photoresist material is applied over the oxide layer 24 and exposed to selected radiation through a patterned transparency, as described above, and when developed will be removed in the areas where windows 26 are to be located. This exposes the oxide 24 in those areas, which exposed areas of oxide are then etched away as described to form the windows 26 through which are exposed the P-layer 14.

A P-layer 28 is then epitaxially deposited over the oxide layer 24 to a height of approximately 100 microns (4 mils). This epitaxial deposition process is substantially identical to the process described above in connection with the formation of N-layer 12 except that the particular dopant used will be selected from the group of materials which will provide layer 28 with P-type conductivity, such as boron, indium, gallium or aluminum. The P-layer 28 extends into and fills the channels between the islands and actually connects with P-layer 14 through windows 26. In and above windows 26 the newly formed P-layer 28 will be of single crystal material 30 closely approximating the characteristics of layer 14 since layer 28 is grown to have close to the same resistivity as layer 14. The remaining portions of layer 28 are polycrystalline.

A layer 32 of aluminum is then deposited over the exposed surfaces of layer 28 and is alloyed into layer 28 to form an ohmic contact. An electrical contact (not shown) is made to aluminum layer 32 and the wafer is then placed in a bath of ethanol or methanol containing a 10% concentration of 49% hydrofluoric acid (HF), and a bias is applied to create electrolytic etching which is allowed to proceed for a time period sufficient to completely etch away the P-layer 14. This results in the structure illustrated in FIG. 6 wherein it will be seen that there are a number of separate islands of N-N+ material isolated completely by oxide insulation and supported on a single P-type base.

The etched surface may be polished or otherwise abraded to provide smoothness if desired. After the exposed surface of the islands have been smoothed by removing protruding portions of the oxide 24, they are then provided with semiconductor devices as shown in FIG. 1. For example, a transistor may be made by diffusing into a base region 34 the N-layer 12 and an emitter 36 may be diffused into the base region 34 as is well known in the transistor art.

Since the actual method of forming the electrodes does not constitute a part of this invention and may be accomplished by any of the known techniques fully described in prior patented and published art, it is not believed necessary herein to provide details of such electrode-forming procedures, nor of the processes for providing electrical contacts to the electrodes.

From the foregoing it will be apparent that a novel integrated circuit device has been provided in accordance with the objectives of this invention, as well as a novel method of making such a circuit device. However, it will be apparent that various modifications and changes may be made by those skilled in the art without departing from the spirit of the invention as expressed in the accompanying claims.

We claim:

1. The method of making an integrated circuit device, comprising
   providing a semiconductor wafer with a first layer of one conductivity type material and with a contiguous second layer of opposite conductivity type material,
   coating the surface of the wafer with insulating material,
   forming openings in said insulation over said second layer in areas where separation between active areas is planned,
   forming channels in said second layer through said openings to form a plurality of spaced islands of said opposite conductivity type material on said first layer,
   coating said wafer with a layer of insulating material including the surfaces of said channels,
   forming windows in said coating at selected locations in the bottom of said channels,
   epitaxially depositing semiconductor material of a conductivity type similar to said first layer over said second layer and oxide thereon and within said channels and windows therein to form a third layer the major portion of which is insulating polycrystalline semiconductor material and which has conductive monocrystalline regions extending completely therethrough in alignment with said windows,
   removing said first layer by electrolytic etching,
   and providing said islands with semiconductor devices.

2. The method of making an integrated circuit device as set forth in claim 1 wherein said first layer is removed by forming an ohmic contact on said third layer, and electrolytically etching said first layer to remove it.

3. The method of making an integrated circuit device as set forth in claim 2 wherein the steps of forming an ohmic contact comprises depositing a layer of aluminum upon the surface of said conductive layer and alloying the aluminum therein.

4. The method of making an integrated circuit device as set forth in claim 1 wherein the step of forming channels in said second layer comprises electrolytically etching the second layer to produce spaced islands having critically controlled dimensions.

5. The method of making an integrated circuit device as set forth in claim 1 wherein said insulating material is silicon dioxide.

References Cited

UNITED STATES PATENTS

| | | | |
|---|---|---|---|
| 3,288,656 | 11/1966 | Nakamara | 148—33.5 |
| 3,290,753 | 12/1966 | Chang | 29—25.3 |
| 3,308,354 | 3/1967 | Tucker | 317—234 |
| 3,312,879 | 4/1967 | Godejahn | 317—234 |
| 3,320,485 | 5/1967 | Buie | 317—101 |
| 3,323,241 | 6/1967 | Blair et al. | 40—28 |
| 3,327,182 | 6/1967 | Kisinko | 317—235 |
| 3,332,137 | 7/1967 | Kenney | 29—423 |
| 3,357,871 | 12/1967 | Jones | 148—175 |
| 3,385,729 | 5/1968 | Larchian | 117—200 |

OTHER REFERENCES

IBM Tech. Disc. Bull., "Fabrication of Planar Arrays of Semiconductor Chips By Epitaxial Growth," H. N. Yu, vol. 7, No. 11, April 1965, p. 1104.

JERRY D. CRAIG, Primary Examiner

U.S. Cl. X.R.

148—175, 187; 317—235